United States Patent [19]

Itoh

[11] 4,319,143
[45] Mar. 9, 1982

[54] IMPEDANCE CONVERTING CIRCUIT

[76] Inventor: Shinobu Itoh, 5-6-10-401, Shinakawa, Mitaka-shi, Tokyo, Japan

[21] Appl. No.: 113,979

[22] Filed: Jan. 21, 1980

[30] Foreign Application Priority Data

Jan. 19, 1979 [JP] Japan ................................. 54-4970

[51] Int. Cl.³ ............................................. H03F 1/08
[52] U.S. Cl. .................................. 307/151; 323/224; 323/225; 323/226; 323/271
[58] Field of Search ................... 307/151, 11, 42, 149, 307/98, 253; 178/45, 46; 330/282, 271; 323/64, 66, 19, 224, 225, 226, 271; 363/135

[56] References Cited

U.S. PATENT DOCUMENTS

Re. 29,286  6/1977  Fukaya et al. .................. 330/271 X
3,896,369  7/1975  Nakata ................................. 323/19
4,234,853  11/1980  Yamaguchi ..................... 330/282 X

*Primary Examiner*—L. T. Hix
*Assistant Examiner*—S. D. Schreyer

[57] ABSTRACT

An impedance converting circuit having an impedance circuit connected in series to a load circuit and an active element having a main electrode connected to both ends of the load circuit and a control electrode connected to a reference potential. In this case, an input signal is supplied across both ends of the serially connected load circuit and impedance circuit.

7 Claims, 6 Drawing Figures

IMPEDANCE CONVERTING CIRCUIT

BACKGROUND OF THE INVENTION

1. Field of the Invention

This invention relates generally to an impedance converting circuit, and is directed more particularly to an impedance converting circuit suitable for use with such a circuit in which a number of load circuits are driven by a single signal source.

2. Description of the Prior Art

In general, in the case where an input signal is fed to a load circuit from a signal source, since the internal impedance of the circuit viewed from the signal source to the load is low, a large current is required with the result that much power is consumed and the conversion efficiency of the circuit becomes poor. This is especially, the case when a number of load circuits are driven by a single signal source. Since the capacity of the signal source must be selected large relative to the consumed current by the load(s), the circuit becomes complicated and expensive.

OBJECTS AND SUMMARY OF THE INVENTION

Accordingly, an object of this invention is to provide an impedance converting circuit free of the prior art defect. Another object of the invention is to provide an impedance converting circuit which is superior in conversion efficiency and simple in construction and in which a single signal source is sufficient for any capacity or number of load circuits.

According to this invention, an impedance converting circuit is provided which comprises:

(A) an impedance circuit connected in series to a load circuit, (B) an active element having a main current path connected in parallel across of the load circuit and a control electrode connected to a reference potential, and (C) means for supplying an input signal across both ends of said serially connected load circuit and impedance circuit.

Other objects, features and advantages of the present invention will become apparent from the following description taken in conjunction with the accompanying drawings through which the like references designate the same elements.

DESCRIPTION OF THE PREFERRED EMBODIMENTS

The present invention will be hereinafter described with reference to the attached drawings.

Figure 1:
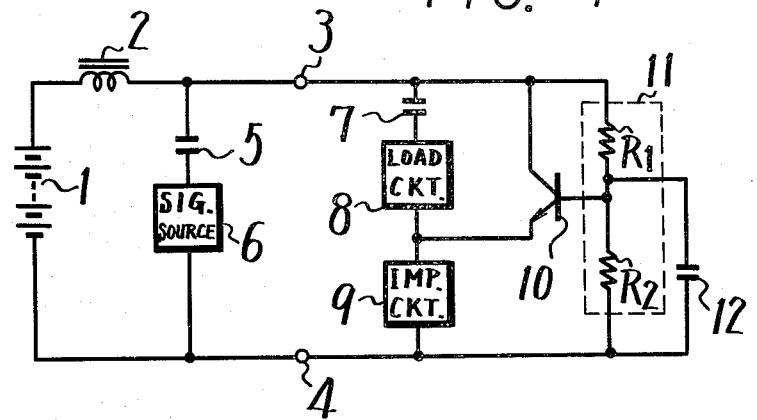
FIG. 1 is a circuit diagram showing, partially in block, an example of the present invention, and FIGS. 2 to 6 inclusive, are circuit diagrams respectively showing examples to which this invention may be applied.

FIG. 1 is a circuit diagram showing an example of the impedance converting circuit according to this invention. In FIG. 1, 1 designates a power source whose positive end is connected through a high impedance element 2 to an input terminal 3 and whose negative end is connected to another input terminal 4. Between input terminals 3 and 4 there is connected a signal source 6 in parallel to the power source 1 through a capacitor 5 which serves to block the DC current. The high impedance element 2 is also provided to block the signal current from signal source 6 from flowing into the power source side and then being attenuated.

A load circuit 8 and an impedance circuit 9 are connected in series between input terminals 3 and 4 through a coupling capacitor 7 which can be omitted if desired. The impedance circuit 9, may be for example, a resistor, an inductor, a constant current source or the like.

To the connection point between load circuit 8 and the impedance circuit 9, there is connected the emitter of an active element such as a transistor 10 whose collector is connected to the input terminal 3 and to one terminal of the load circuit 8 through the coupling capacitor 7 and whose base is connected to the input terminal 3 through a resistor R1 of a bias circuit 11 and also to the other input terminal 4 through a resistor R2 of the bias circuit 11. The transistor 10 is supplied with a bias voltage through resistors R1 and R2.

The base of transistor 10 is connected through a capacitor 12 to the input terminal 4 or grounded in view of AC so that transistor 10 serves as the base-grounded type amplifier circuit.

The operation of the impedance converting circuit of the invention will now be described. When the signal current is fed from signal source 6 to load circuit 8, this signal current also flows through impedance circuit 9 connected in series to load circuit 8. Thus, the potential across impedance circuit 9 is varied. At this time, the base-emitter potential of transistor 10, which is previously energized by bias circuit 11, under a predetermined bias condition, is also varied, and accordingly the emitter current of transistor 10 is varied. The emitter current changes so as to complement the varied component of the signal current. Accordingly, the potential change by the signal current in impedance circuit 9 is cancelled by the emitter current which is changed in response to the changed amount of the potential.

In this case, almost all the emitter current of transistor 10 flows from its collector, but the collector current is reverse in phase to the current flowing through load circuit 8, namely when one of the currents increases, the other current decreases or vice versa or they flow complementary. Thus, a constant current always flows through the impedance circuit 9. Accordingly, it is sufficient that the input signal fed to the connection point between the collector of transistor 10 and coupling capacitor 7 from signal source 6 is only little. That is, it is noted that the circuit of FIG. 1 including the load circuit 8 is a positive feedback circuit and presents a high internal impedance. Since the impedance circuit 9 has constant current operation for the signal from the signal source 6, its effective impedance is low and hence it proposes no insertion loss.

Further, transistor 10 forms the base-grounded type amplifier so that its collector impedance is high. Thus, the signal voltage applied to the collector thereof at the same time as the signal current gives no change in the collector current. Since the positive feedback amount is selected little smaller than 1 so that unless there occur no phase error or the like, the circuit of FIg. 1 is very high in stability.

Figure 2:
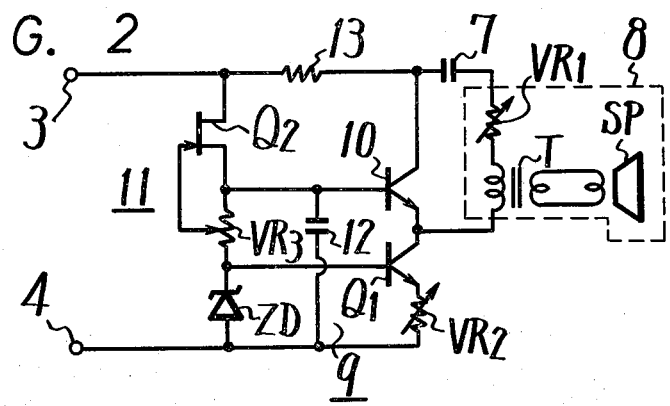

FIG. 2 is a connection diagram showing a speaker circuit in which the present invention is employed, so that in FIG. 2 references same as those of FIG. 1 designate the same elements. In the circuit of FIG. 2, a speaker SP is employed as the load. The load circuit 8 is formed of speaker SP, variable resistor VR1 for adjusting the output and coupling transformer T, and as impedance circuit 9 a constant current circuit, which is formed of transistor Q1, variable resistor VR2 and Zener Diode ZD, is used. And, as the bias circuit 11, a constant current circuit, which consists of field effect transistor Q2, variable resistor VR3 and Zener Diode ZD, is used. This bias circuit 11 with the above construction avoids lowering of the impedance of the signal line. A resistor 13 is connected between the collector of transistor 10 and the input terminal 3 in parallel to the load circuit 8 viewed from the collector of transistor 10 to reduce bad influence from the outside. In this case, since the input impedance of the circuit viewed from the signal source side is high, the insertion loss caused by resistor 13 is small.

With the circuit of FIG. 2, the load current flowing through load circuit 8 and the collector current of transistor 10 are in the complementary relation as set forth above and hence a constant current always flows through impedance circuit 9. As a result, it is enough that the signal current fed to the connection point between the collector of transistor 10 and coupling capacitor 7 is a small current irrespective of the capacity of the loads.

Figure 3:
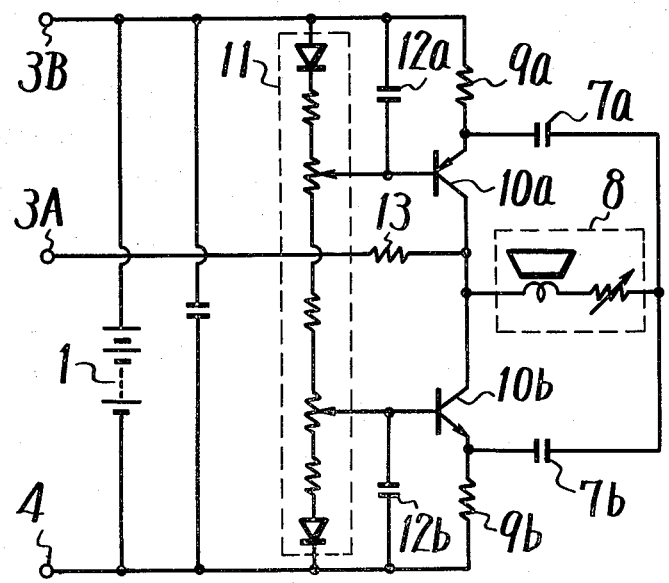

FIG. 3 is a circuit diagram showing a further example of a speaker circuit in which this invention is used similarly to the example of FIG. 2 so that in FIG. 3 the parts corresponding to those of FIG. 1 are marked with the same references and their detailed description will be omitted. The example of FIG. 3 can be used in the case where the power source is contained in the circuit itself or is supplied from the outside.

In the example of FIG. 3 transistors 10A and 10B are connected to perform a push-pull operation, and the signal source is connected between input terminals 3A and 4. When an external power source is used, it is connected between input terminals 3B and 4. Input terminal 3A is connected through resistor 13 to the collectors of transistors 10A and 10B and to one end of load circuit 8 whose other end is not connected with input terminal 3A, so that the high impedance can be easily kept. Further, in the circuit of FIG. 3, since the bias circuit 11 is not connected to the signal line, it is not needed to provide high impedance. Thus, the circuit can be simplified.

Figure 4:
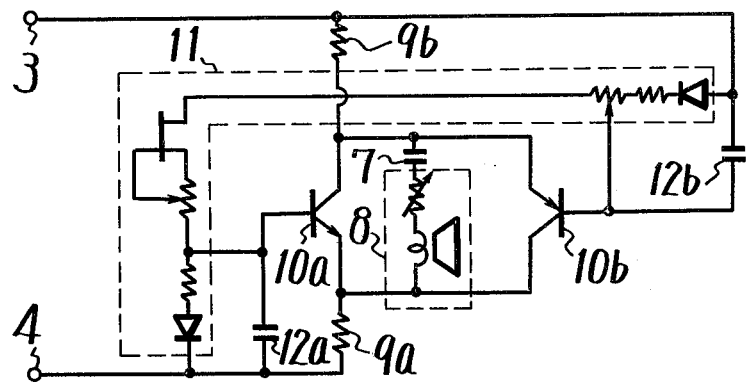

FIG. 4 is a circuit diagram showing another example of a speaker circuit in which the example of the invention is used, so that in FIG. 4 the parts corresponding to those of FIG. 1 are marked with the same references and their detailed description will be omitted.

Figure 5:
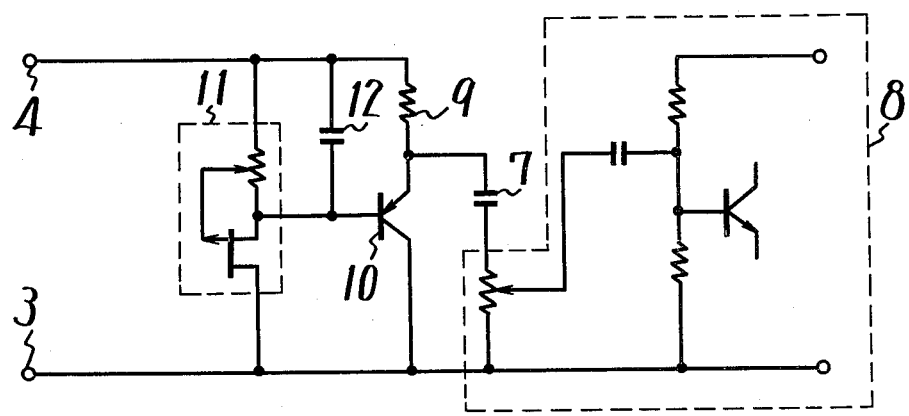

In the circuit of FIG. 4, transistors 10A and 10B are connected to achieve parallel operation to present high interval impedance similar to the previous example. FIG. 5 is a circuit diagram showing such a case where this invention is applied to the intermediate stage of an amplifier. In FIG. 5, the parts corresponding to those of FIG. 1 are marked with the same references and their detailed description will be omitted.

In the example of FIG. 5, a resistor-coupling amplifier circuit is used as the load circuit 8. With this construction, an input signal source of high impedance can be used to improve the characteristics of the amplifier and to give wide use-ability to the amplifier.

Figure 6:
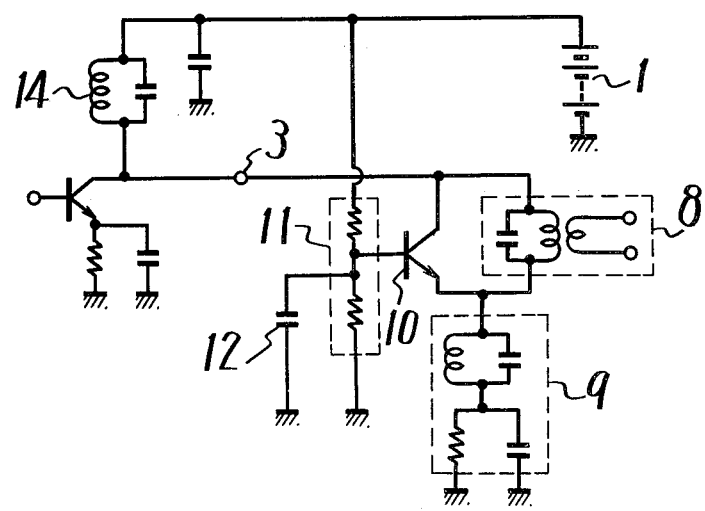

FIG. 6 is a circuit diagram showing such a case where this invention is applied to a radio frequency circuit. In FIG. 6 the parts corresponding to those of FIG. 1 are marked with the same references and their detailed description will be omitted. In the circuit of FIG. 6, even if a large load is used in load circuit 8, the connection point between the collector of transistor 10 and input terminal 3 is kept at high impedance so that the Q of resonance circuit 14 of the radio frequency circuit is prevented from being lowered.

In the examples of FIGS. 2, 3 and 4, it is possible to use a pulse driver or the like in place of the speaker. In such a case, due to the effect of high impedance, although the signal voltage is of an ordinary value, the signal current can be selected very small. Therefore, a drive pulse signal can be made as a small output and hence transmission loss can be reduced and also mutual interference with adjacent circuits can be reduced. According to the impedance converting circuit of the invention constructed as above, the internal impedance of the circuit viewed from the signal source can be easily made high so that a number of loads can be driven by the signal source with a small output current and hence the load circuit of large capacity can be driven by a single signal source. Further, the circuit of the invention can be made as a positive feedback circuit with the feedback amount little smaller than 1, LC the circuit is very stable. Further, even though there are a plurality of loads, a pair of signal lines are sufficient in this invention. Therefore, the circuit construction becomes simple. It is needless to say that the present invention is not limited to the above example only, but this invention can be applied to the side tone attenuation of, for example, a telephone circuit and so on with the same effects.

It will be apparent that many modifications and variations could be effected by one skilled in the art without departing from the spirits or scope of the novel concepts of the invention.

I claim as my invention

1. An impedance converting circuit, comprising:
(A) an impedance circuit connected in series to a load circuit:
(B) an active element having a main current path connected in parallel across said load circuit and a control electrode connected to a reference potential: and
(C) means for supplying an input signal across both ends of said serially connected load circuit and impedance circuit.

2. An impedance converting circuit according to claim 1, further comprising means for selectively biasing said active element.

3. An impedance converting circuit as claimed in claim 1, in which said active element is a transistor whose collector electrode is connected to one end of said load circuit, whose emitter electrode is connected to the other end of said load circuit, and whose base electrode is connected to the reference potential.

4. An impedance concerting circuit as claimed in claim 1, in which said impedance circuit is a constant current circuit including an active element.

5. An impedance converting circuit as claimed in claim 1, in which said impedance circuit is a resonance circuit.

6. An impedance converting circuit as claimed in claim 2, in which said biasing means includes a transistor and a resistor.

7. An impedance converting circuit as claimed in claim 1, in which said active element is formed of two transistors connected in push-pull manner.

* * * * *